US010694647B2

(12) United States Patent
Yokoyama et al.

(10) Patent No.: US 10,694,647 B2
(45) Date of Patent: Jun. 23, 2020

(54) TRANSFER UNIT, TRANSFER APPARATUS, AND HOLDING UNIT

(71) Applicant: HIRATA CORPORATION, Kumamoto-shi, Kumamoto-ken (JP)

(72) Inventors: Shinji Yokoyama, Kumamoto (JP); Keisuke Teramoto, Kumamoto (JP); Shuichiro Araki, Kumamoto (JP)

(73) Assignee: HIRATA CORPORATION, Kumamoto-Shi (JP)

( * ) Notice: Subject to any disclaimer, the term of this patent is extended or adjusted under 35 U.S.C. 154(b) by 302 days.

(21) Appl. No.: 15/716,985

(22) Filed: Sep. 27, 2017

(65) Prior Publication Data

US 2018/0092263 A1    Mar. 29, 2018

(30) Foreign Application Priority Data

Sep. 29, 2016 (JP) .................................. 2016-192088

(51) Int. Cl.
*H05K 13/04*      (2006.01)
*B25J 15/04*      (2006.01)
*B25J 15/06*      (2006.01)
*B25J 9/02*       (2006.01)
*B25J 15/00*      (2006.01)

(52) U.S. Cl.
CPC .......... *H05K 13/0408* (2013.01); *B25J 9/026* (2013.01); *B25J 15/0052* (2013.01); *B25J 15/0408* (2013.01); *B25J 15/0616* (2013.01); *H05K 13/041* (2018.08); *H05K 13/0409* (2018.08)

(58) Field of Classification Search
CPC .................................. B25J 15/0052; B25J 15/0408; B25J 15/0616; B25J 9/026; H05K 13/0408; H05K 13/0409; H05K 13/041
See application file for complete search history.

(56) References Cited

U.S. PATENT DOCUMENTS

| 5,864,944 A * | 2/1999 | Kashiwagi ......... H05K 13/0452 29/833 |
| 6,649,926 B2 | 11/2003 | Suhara et al. |
| 6,931,718 B2 | 8/2005 | Isogai et al. |
| 7,278,204 B2 | 10/2007 | Isogai et al. |

(Continued)

FOREIGN PATENT DOCUMENTS

| JP | 2002-079484 A | 3/2002 |
| JP | 2002-200585 A | 7/2002 |

*Primary Examiner* — Minh N Trinh
(74) *Attorney, Agent, or Firm* — Buchanan Ingersoll & Rooney PC

(57) ABSTRACT

A transfer unit includes a holding unit, and a driving unit configured to vertically move the holding unit. The holding unit includes a holding portion configured to hold a work, a movable portion configured to support the holding portion, a support portion configured to support the movable portion such that the movable portion is vertically displaceable, and a biasing portion configured to bias the movable portion downward with respect to the support portion. The support portion has a guide surface which guides displacement of the movable portion, and the movable portion has an abutting surface which abuts against the guide surface. Each of the guide surface and the abutting surface is a surface which tapers off upward or downward.

9 Claims, 18 Drawing Sheets

(56) References Cited

U.S. PATENT DOCUMENTS

| | | | | |
|---|---|---|---|---|
| 7,614,144 B2* | 11/2009 | Ota | ............... | H05K 13/041 29/833 |
| 8,136,219 B2* | 3/2012 | Endo | ............... | H05K 13/04 29/593 |
| 10,092,989 B2* | 10/2018 | Isobe | ............... | B23Q 17/005 |
| 2011/0318144 A1* | 12/2011 | Kobayashi | ............... | B65G 49/061 414/222.01 |
| 2018/0092263 A1* | 3/2018 | Yokoyama | ............... | B25J 15/0408 |

* cited by examiner

F I G. 9
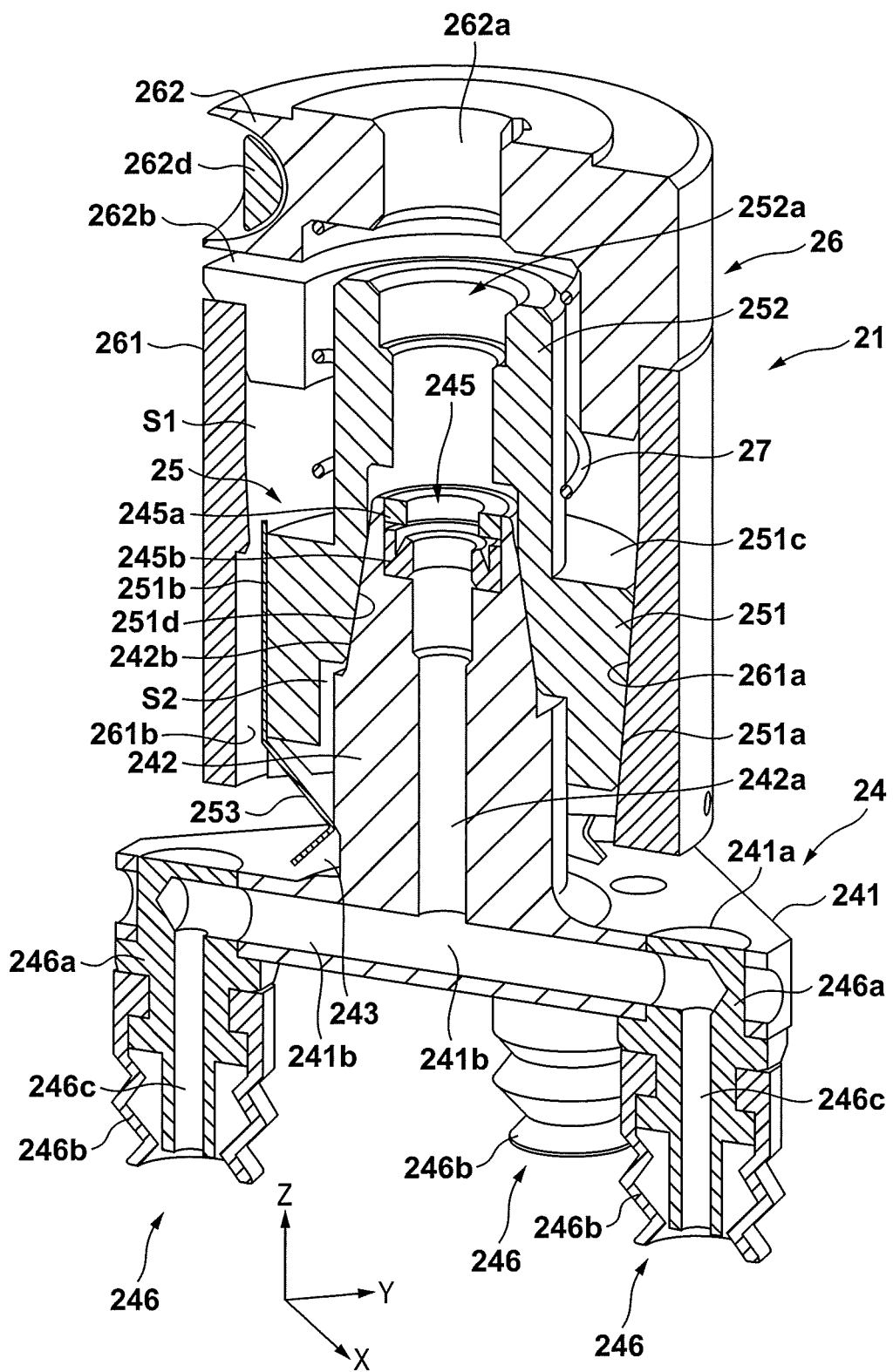

TRANSFER UNIT, TRANSFER APPARATUS, AND HOLDING UNIT

BACKGROUND OF THE INVENTION

Field of the Invention

The present invention relates to a transfer unit, a transfer apparatus, and a holding unit.

Description of the Related Art

In facilities for handling works such as small-sized electronic parts, a large number of works of the same kind are sometimes conveyed as they are placed in a container. When transferring works between containers or between a container and an assembling apparatus or processing apparatus, an apparatus which individually holds and transfers a work is used.

When transferring a work, position control is performed to move a holding unit for holding the work to a preset pick-up position, and the work is held from above. When the work and holding unit come in contact with each other, the work may be damaged due to the impact with the work. To absorb this impact at the time of contact, the holding unit is given a vertical buffering function (for example, Japanese Patent Laid-Open Nos. 2002-200585 and 2002-079484).

Even when works are of the same kind, the postures of the works placed in a container are not necessarily constant. Also, the sizes of the works may be different due to manufacturing errors. If the holding unit for holding a work cannot adapt itself to the state of each work as described above, the holding unit may damage the work when holding it. However, if the position of the holding unit is shifted in accordance with the state of each work, the positional accuracy of a placement position in the transfer destination decreases.

SUMMARY OF THE INVENTION

It is an object of the present invention to buffer an impact when holding a work, and prevent a decrease in positional accuracy of the held work.

According to a first aspect of the present invention, there is provided a transfer unit comprising: a holding unit configured to hold a work; and a driving unit configured to vertically move the holding unit, wherein the holding unit includes: a holding portion configured to hold a work; a movable portion configured to support the holding portion; a support portion configured to support the movable portion such that the movable portion is vertically displaceable; and a biasing portion configured to bias the movable portion downward with respect to the support portion, the support portion has a first guide surface which guides displacement of the movable portion, the movable portion has a first abutting surface which abuts against the first guide surface, and each of the first guide surface and the first abutting surface is a surface which tapers off upward or downward, such that the first guide surface and the first abutting surface abut against each other and are positioned when the movable portion is displaced downward with respect to the support portion.

According to a second aspect of the present invention, there is provided a transfer apparatus comprising: the transfer unit according to the first aspect of the present invention; a driving unit configured to move the transfer unit from a work transfer source to a work transfer destination, and an image capturing unit configured to capture, from below, an image of a work held by the holding portion according to the first aspect of the present invention.

According to a third aspect of the present invention, there is provided a holding unit comprising: a holding portion configured to hold a work; a movable portion configured to support the holding portion; a support portion configured to support the movable portion such that the movable portion is displaceable in a first direction and in a second direction opposite to the first direction; and a biasing portion configured to bias the movable portion in the first direction with respect to the support portion, wherein the first direction is a direction in which the holding portion is spaced apart from the support portion, the support portion has a guide surface which guides displacement of the movable portion, the movable portion has an abutting surface which abuts against the guide surface, and each of the guide surface and the abutting surface is a surface which tapers off in the first direction or the second direction.

Further features of the present invention will become apparent from the following description of exemplary embodiments (with reference to the attached drawings).

BRIEF DESCRIPTION OF THE DRAWINGS

FIG. 9 is a sectional view of the holding unit shown in FIG. 3.

DESCRIPTION OF THE EMBODIMENTS

Figure 1:
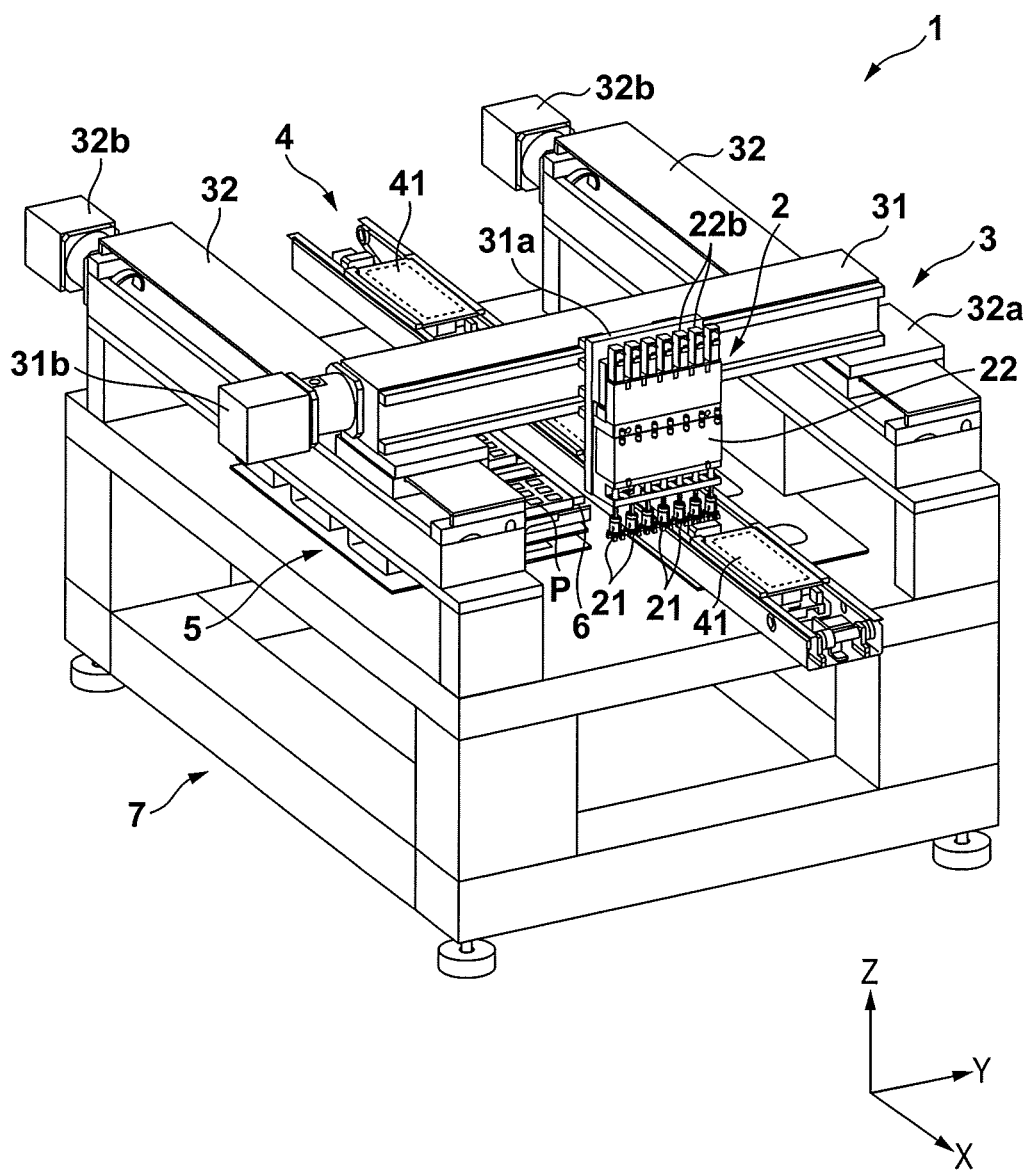
FIG. 1 is a perspective view of a transfer apparatus.

<Outline of Apparatus>
FIG. 1 is a perspective view of a transfer apparatus 1 according to an embodiment of the present invention. The transfer apparatus 1 is an apparatus for transferring a work such as an electronic part. In FIG. 1, arrows X, Y, and Z indicate directions perpendicular to each other. That is, the arrow Z indicates the vertical direction as a first direction, and the arrows X and Y indicate the horizontal directions as a second direction and third direction perpendicular to the first direction and perpendicular to each other.

The transfer apparatus 1 includes a transfer unit 2, a driving unit 3, conveyor units 4 and 5, and an image capturing unit 6. The conveyor units 4 and 5 are mechanisms for conveying a work. The conveyor unit 4 is a conveyor such as a belt conveyor extended in the X direction, and conveys a conveyance target 41 in the X direction. A work positioning mechanism (not shown) positions the conveyance target 41 in a predetermined position of the conveyor unit 4. The conveyance target 41 is, for example, a tray containing a large number of works, or a circuit board. The conveyor unit 5 is a conveyor such as a belt conveyor extended in the Y direction, and conveys a tray P in the Y direction. A tray positioning mechanism (not shown) positions the tray P in a predetermined position of the conveyor unit 5. In the tray P, work accommodating portions are arranged in a matrix, and a work is placed in each accommodating portion.

The transfer unit 2 is a mechanism for holding a work, and the driving unit 3 is a mechanism for moving the transfer unit 2. In this embodiment, a work is transferred between the conveyor units 4 and 5. The driving unit 3 moves the transfer unit 2 in the X and Y directions, and moves a work from one of the conveyor units 4 and 5 as a work transfer source to the other one of the conveyor units 4 and 5 as a work transfer destination. In this embodiment, the driving unit 3 is a gantry type mechanism, and includes a beam 31 extending in the Y direction, and a pair of beams 32 extending in the X direction and parallel to each other. The beam 31 is installed between the pair of beams 32. The beam 31 includes a slider 31a, and a mechanism which includes a motor 31b as a driving source and moves the slider 31a in the Y direction. The transfer unit 2 is held on the slider 31a. Each beam 32 includes a slider 32a, and a mechanism which includes a motor 32b as a driving source and moves the slider 32a in the X direction. The two end portions of the beam 31 are supported by the sliders 32a. When the motors 32b of the pair of beams 32 are synchronously controlled, therefore, the sliders 32a are translated in the X direction, and the beam 31 is moved in the X direction.

The transfer unit 2 includes a plurality of holding units 21 capable of individually holding works, and a driving unit 22 capable of moving in the vertical direction of the holding units 21 and capable of rotating around the Z-axis. In this embodiment, the total number of the plurality of holding units 21 is seven, and they are arranged in a row in the Y direction. Works held by the holding units 21 are three-dimensionally moved when the driving unit 3 moves the transfer unit 2 in the X and Y directions, and the driving unit 22 vertically moves the holding units 21 in the Z direction.

The image capturing unit 6 is placed between the conveyor units 4 and 5, and can capture an image of a work held by the holding unit 21 from below (from the side opposite to the holding unit 21). The image capturing unit 6 is, for example, a line sensor extended in the X direction. By analyzing the image of a work captured by the image capturing unit 6, it is possible to detect, for example, a positional deviation of the work from the central axis of the holding unit 21 and the direction of the work held by the holding unit 21. Since a work release position in the transfer destination is adjusted, more accurate work transfer is possible. For example, the central axis (an elevating shaft 22a: see FIG. 2) of the holding unit 21 is used as a positional reference, and a central point obtained by capturing an image of this central axis (a central axis L: see FIG. 10) from below is used as a reference point. In this case, the holding position of a work can be calculated from the positions of a plurality of portions of the work and the reference point.

<Transfer Unit>

Figure 2:
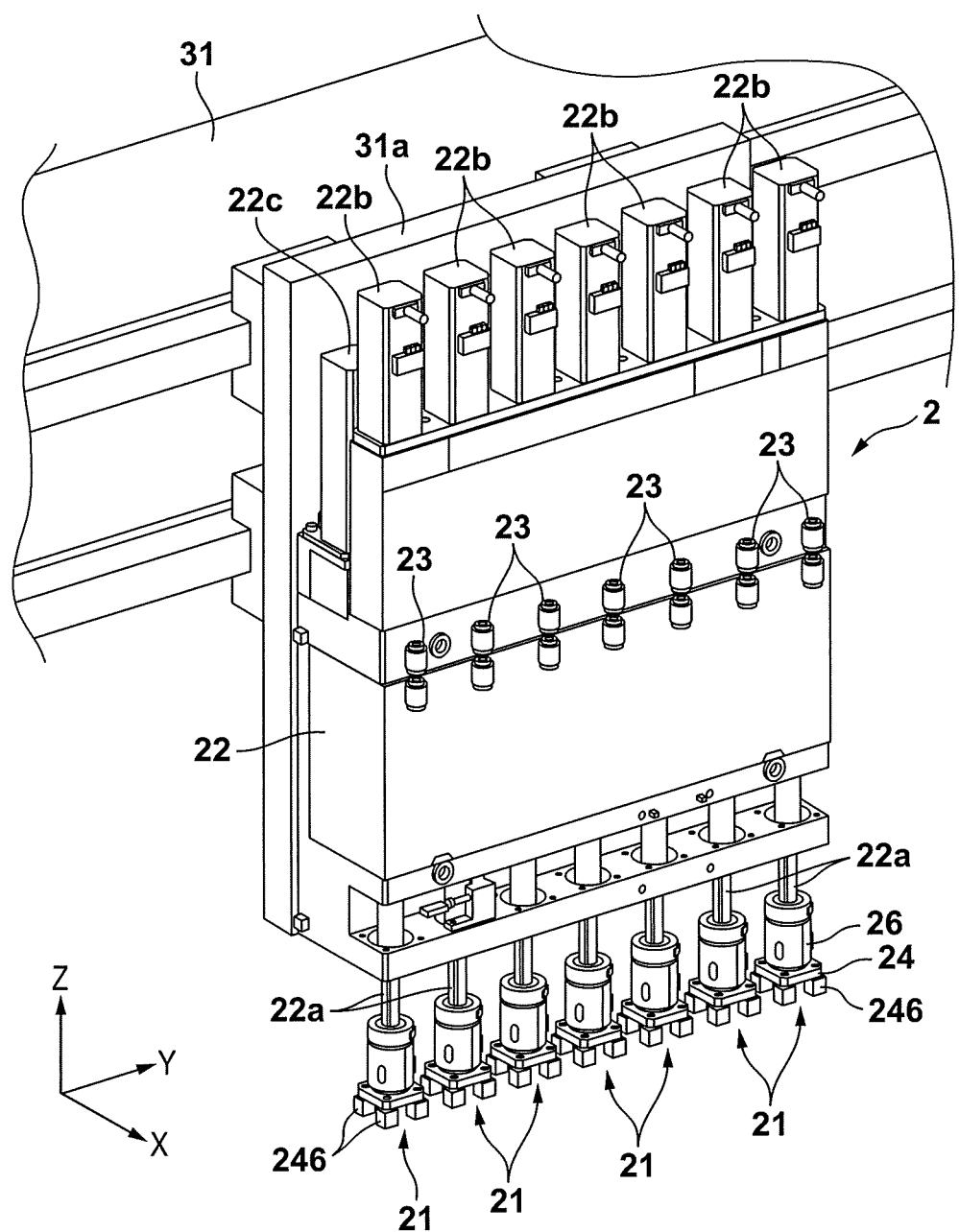
FIG. 2 is a perspective view of a transfer unit of the transfer apparatus shown in FIG. 1.

The transfer unit 2 will be explained in more detail below. FIG. 2 is a perspective view of the transfer unit 2. The transfer unit 2 includes the elevating shaft 22a for each holding unit 21. The elevating shaft 22a is a vertically extending hollow attaching member to which the holding unit 21 is attached. In this embodiment, the elevating shaft 22a is a shaft whose axial direction is the Z direction. The holding unit 21 is attached to the lower end portion of the elevating shaft 22a. The driving unit 22 includes motors 22b and 22c for each elevating shaft 22a. The motor 22b is a driving source of a rotating mechanism for rotating the elevating shaft 22a around its central axis (an alternate long and short dashed line in FIG. 10) as a rotation center. By rotating the elevating shaft 22a, it is possible to pivot the holding unit 21 around the central axis, and change the posture (direction) of a held work by rotating it. The motor 22c is a driving source of an elevating mechanism for vertically moving the elevating shaft 22a. Although FIG. 2 shows only one motor 22c, the motor 22c is installed for each elevating shaft 22a. The rotating mechanism of the elevating shaft 22a may also be a mechanism which has a driving shaft spline-coupled with the elevating shaft 22a, and rotates the driving shaft by the motor 22b. This spline coupling permits a Z-direction movement of the elevating shaft 22a. The elevating mechanism may also be a ball screw mechanism. Furthermore, the elevating mechanism may also be a mechanism which vertically engages with the elevating shaft 22a while permitting the rotation of the elevating shaft 22a.

In this embodiment, the holding unit 21 chucks and holds a work by negative-pressure suction. For this purpose, the transfer unit 2 has a connecting portion 23 for each holding unit 21. The connecting portion 23 is connected to a negative-pressure source (not shown) such as a pump via a pipe (not shown). In this embodiment, the elevating shaft 22a is a hollow cylindrical member, and a passage formation member 22a1 (FIG. 10) communicating with the connecting portion 23 is formed inside the elevating shaft 22a. The passage formation member 22a1 communicates with the holding unit 21 as will be described later. Note that the work holding method is not limited to negative-pressure suction. For example, the work holding method may also be attraction using a magnetic force, or grasping by an opening/closing driving mechanism.

<Holding Unit>

Figure 3:
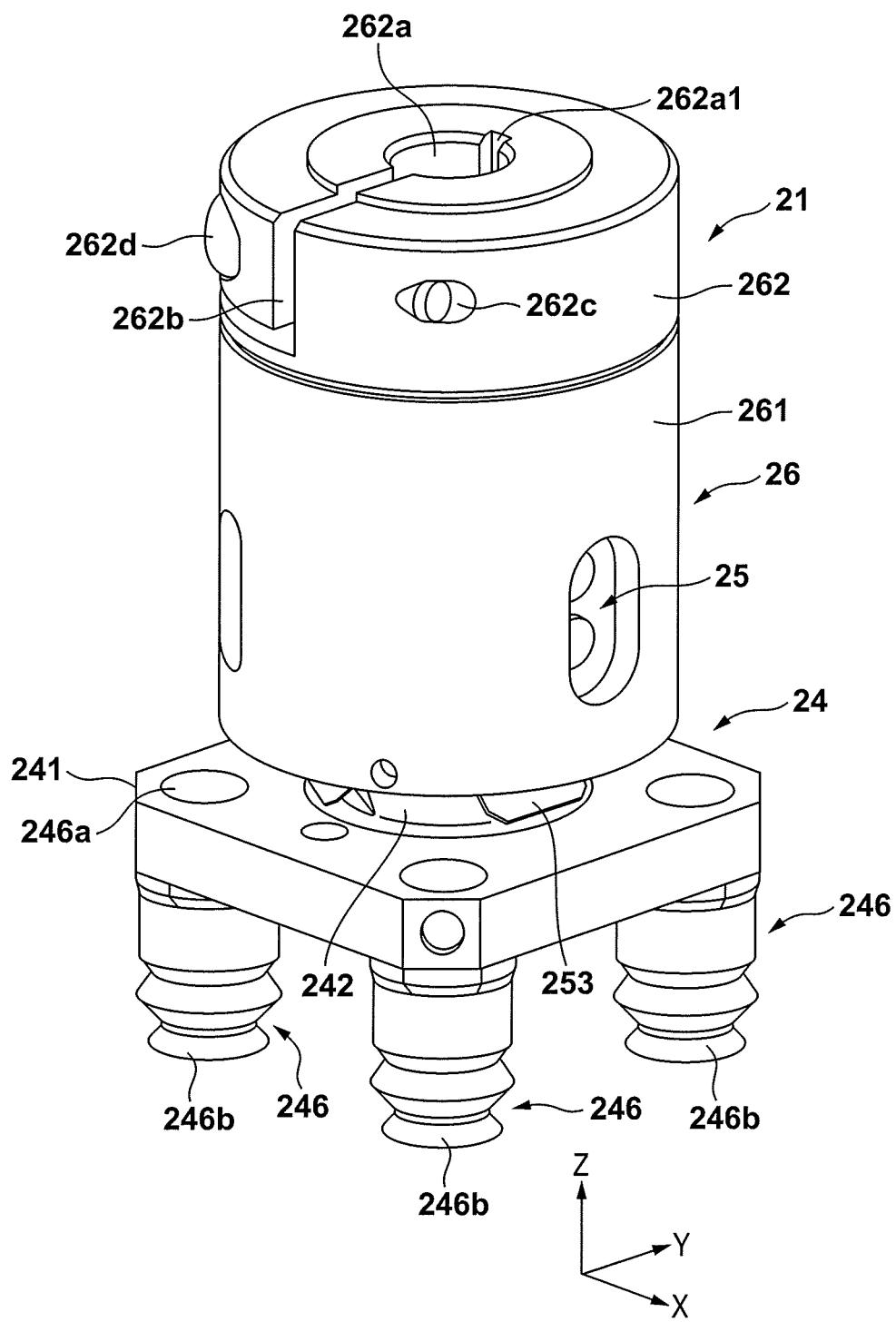
FIG. 3 is a perspective view of a holding unit of the transfer unit shown in FIG. 2.
Figure 4:
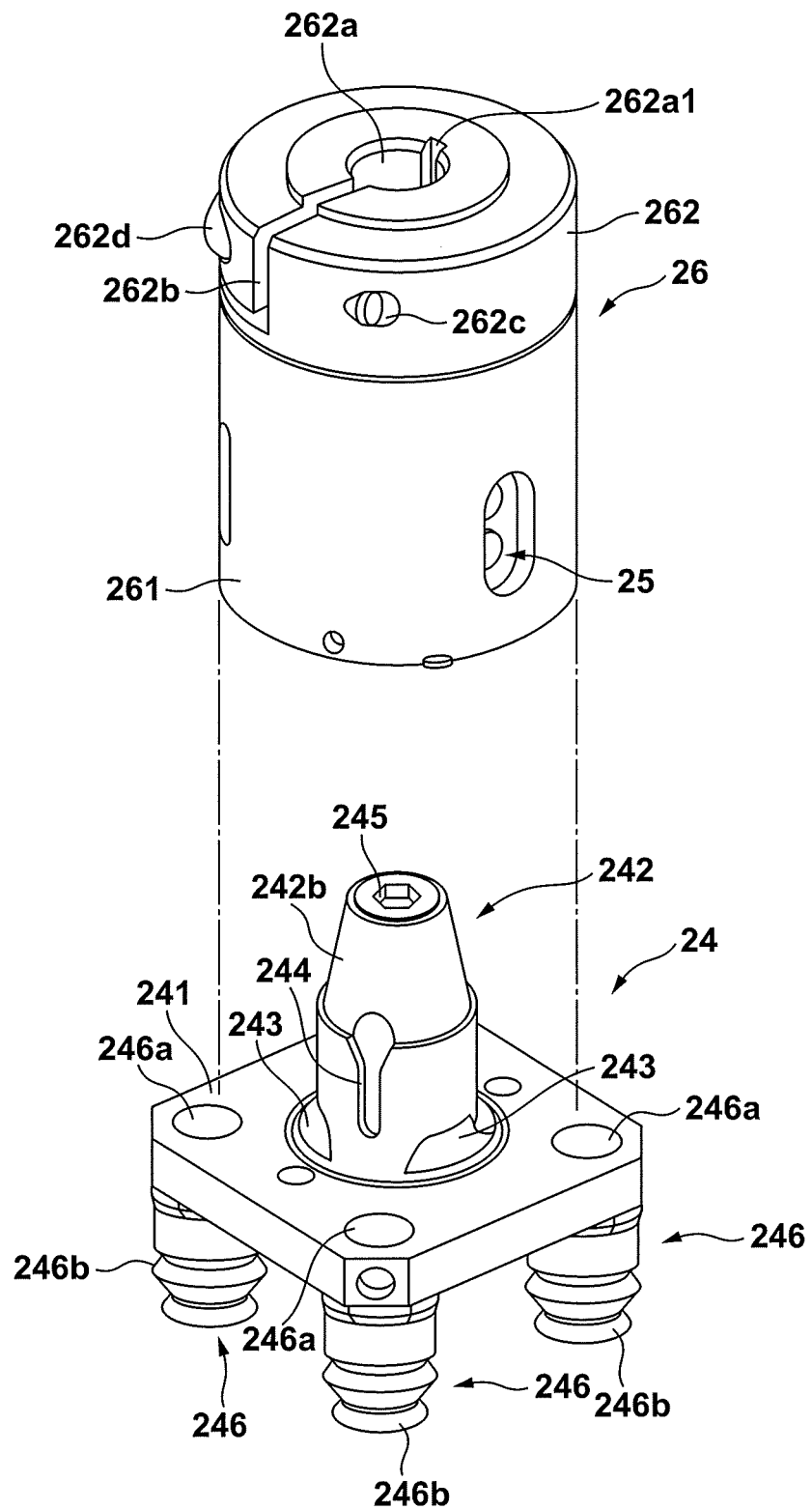
FIG. 4 is an exploded perspective view of the holding unit shown in FIG. 3.
Figure 5:
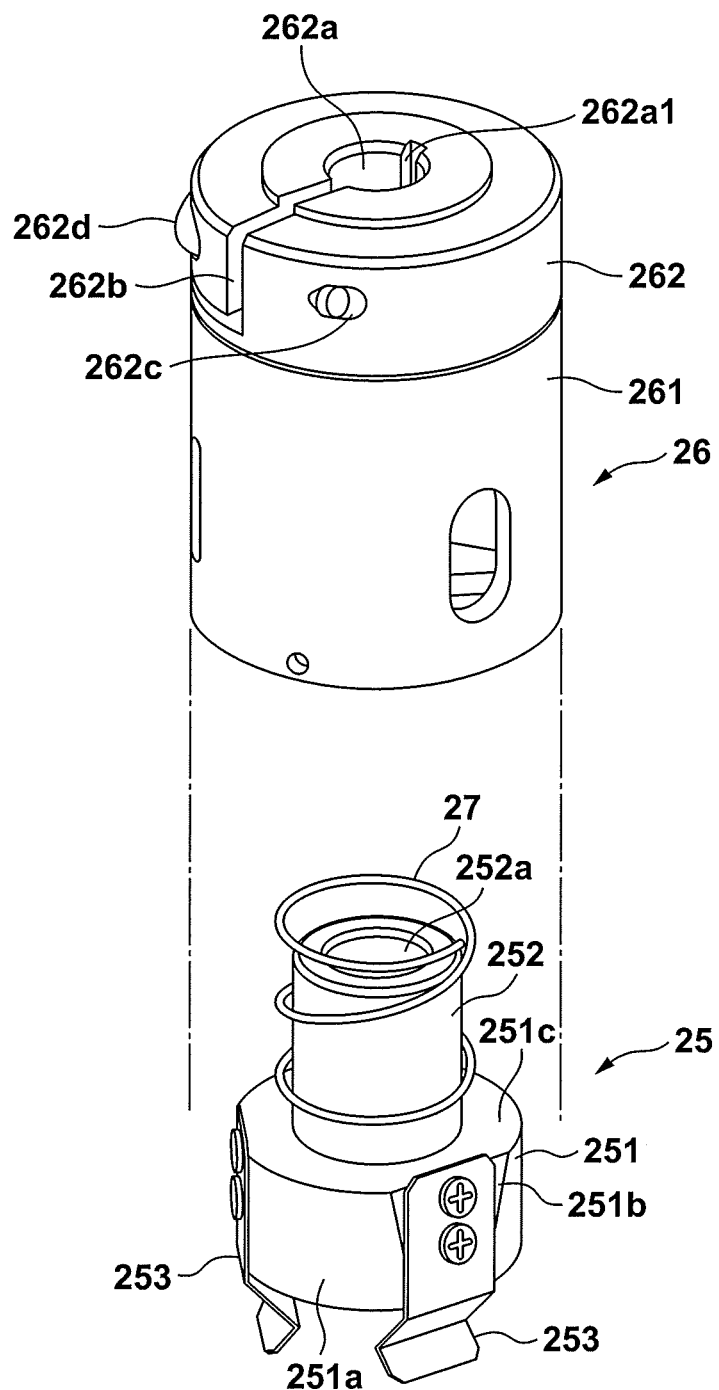
FIG. 5 is an exploded perspective view of the arrangement of a part of the holding unit shown in FIG. 3.

The holding unit 21 will be explained with reference to FIGS. 3 to 5. FIG. 3 is a perspective view of the holding unit 21, FIG. 4 is an exploded perspective view of the holding unit 21, and FIG. 5 is an exploded perspective view of an upper portion of the holding unit 21.

The holding unit 21 includes a holding portion 24 for holding a work, a movable portion 25 for supporting the holding portion 24, a support portion 26 for supporting the movable portion 25 such that the movable portion 25 is vertically displaceable, and a biasing portion 27 for biasing the movable portion 25 downward with respect to the support portion 26. In this embodiment, the support portion 26 is a cylindrical member, and the movable portion 25 and biasing portion 27 are accommodated in the support portion 26. The holding portion 24 is attached to the movable portion 25 so as to be vertically detachable, and hence can be replaced in accordance with the type of work.

Figure 6:
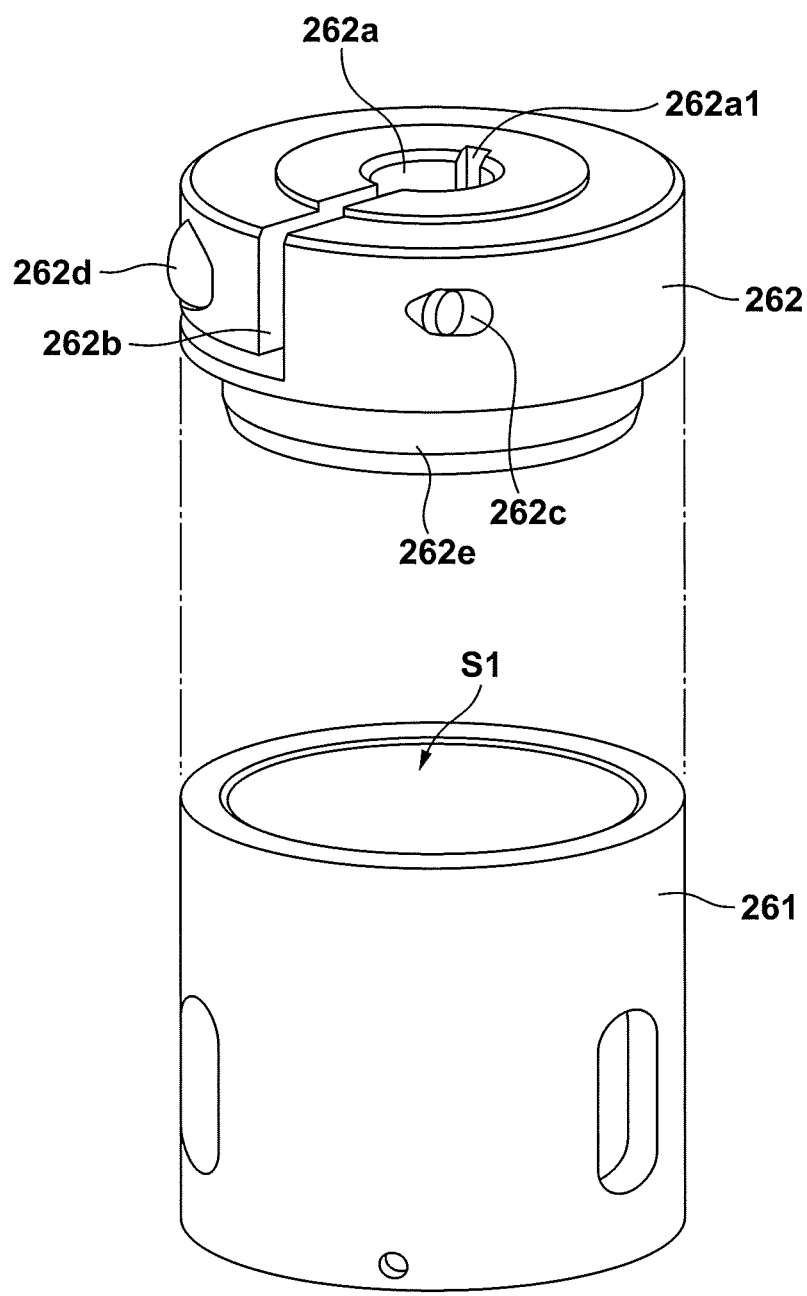
FIG. 6 is an exploded perspective view of the arrangement of a part of the holding unit shown in FIG. 3.

In this embodiment, the support portion 26 is formed by a main body 261 and an attaching portion 262. FIG. 6 is an exploded perspective view of the support portion 26. The main body 261 has a cylindrical shape as a whole, which opens in the upper and lower ends and is coaxial with the central axis L, and an internal space S1 as an internal hole of the main body 261 functions as an accommodation space or operation space of the movable portion 25 and biasing portion 27. In addition, a vertically extending elliptical window (elongated hole) communicating with the internal space S1 is formed in the circumferential wall of the main body 261.

The attaching portion 262 is used for attachment to the elevating shaft 22a. The attaching portion 262 is a lid to be attached to the main body 261 so as to close the upper opening of the main body 261. The attaching portion 262 has a fixing portion 262e to be fixed to the main body 261. The fixing portion 262e is inserted into the main body 261 and fixed to it by fitting, adhesion, screwing, or the like.

An opening 262a which is coaxial with the central axis L and into which the elevating shaft 22a is inserted is formed in the center of the attaching portion 262. A key groove 262a1 is formed in the opening 262a, and an expanding slot 262b is formed in a position almost facing the key groove 262a1. The expanding slot 262b is not formed over the whole diameter of the attaching portion 262, but is formed over only the radius. A tunnel 262c is formed through the circumferential surface of the attaching portion 262 so as to extend across the expanding slot 262b, and a bolt 262d is inserted into the tunnel 262c. A female screw which threadably engages with the bolt 262c is formed in a part of the tunnel 262c. When the bolt 262d is fastened while the elevating shaft 22a is inserted into the opening 262a, the diameter of the opening 262a is reduced, and the attaching portion 262 is fixed to the elevating shaft 22a. Also, the elevating shaft 22a has a key (not shown), and this key is fitted in the key groove 262a1. Consequently, the attaching portion 262 and elevating shaft 22a engage with each other in the circumferential direction.

Referring to FIG. 5, the movable portion 25 includes a main body 251 and a cylindrical portion 252. The main body 251 has a conical shape (more specifically, a truncated conical shape) which is coaxial with the central axis L and tapers off downward as a whole. Abutting surfaces 251a and attaching portions 251b are alternately formed in the circumferential direction on the circumferential surface of the main body 251. In this embodiment, the abutting surface 251a is a conical surface which is coaxial with the central axis L and tapers off downward. A holding member 253 to be engaged with the holding portion 24 is attached to the attaching portion 251b. In this embodiment, the attaching portion 251b is a flat surface, and at least an upper portion is recessed more than the outer circumferential surface of the upper portion of the abutting surface 251a. In other words, the attaching portion 251b is formed by notching the abutting surface 251a in a plane parallel to the Z-axis. In this embodiment, the holding portion 24 is detachably held by a plurality of holding members 253. In this embodiment, the holding member 253 is formed by bending a leaf spring, and capable of holding/releasing the holding portion 24 by elastic deformation. An upper surface 251c formed on the upper portion of the main body 251 functions as a seat surface of the biasing portion 27. The biasing portion 27 is a coil spring in this embodiment, but may also be another kind of elastic member such as rubber. The cylindrical portion 252 is a cylinder having a diameter smaller than that of the upper surface 251c formed on the main body 251. The cylindrical portion 252 is coaxial with the central axis L, and extends upward from the upper surface 251c. The elevating shaft 22a is inserted into a central hole 252a of the cylindrical portion 252.

Figure 7:
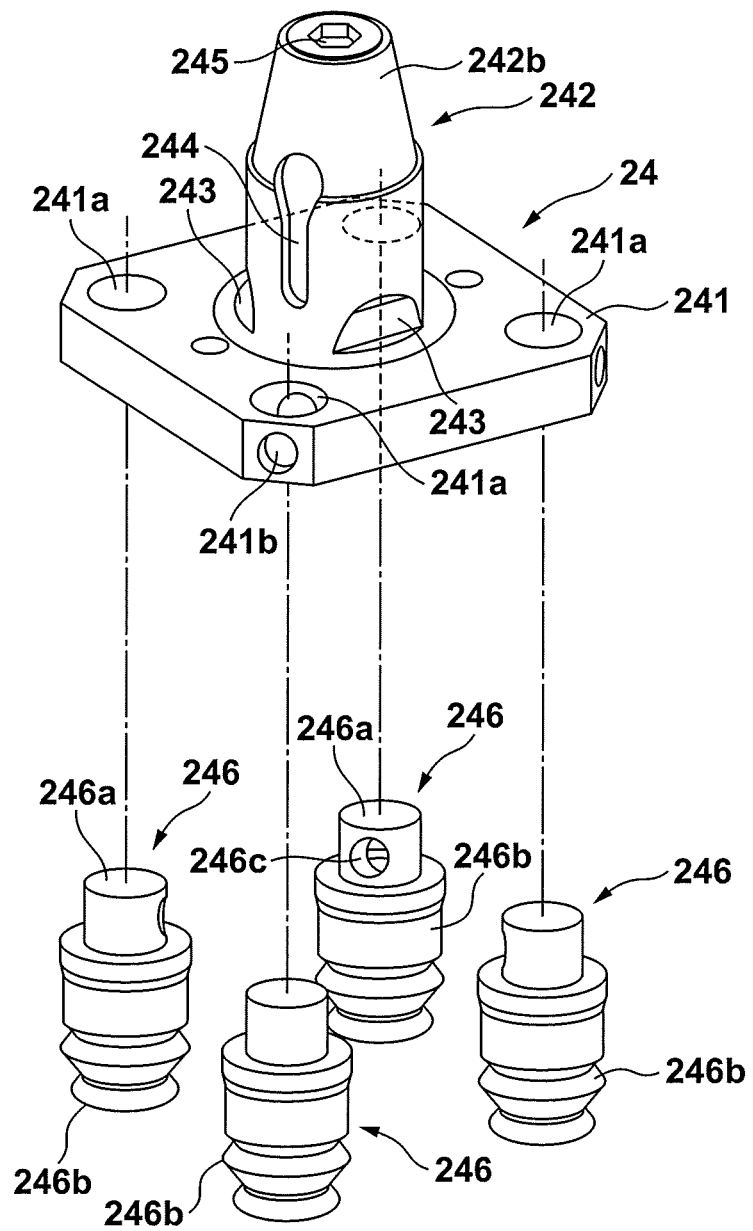
FIG. 7 is an exploded perspective view of the arrangement of a part of the holding unit shown in FIG. 3.

FIG. 7 is an exploded perspective view of the holding portion 24. The holding portion 24 includes a main body (241, 242), and a plurality of tools 246 which are formed below the main body and hold a work. The main body includes a base 241, and a portion 242 to be held which extends upward from the central portion of the base 241. The base 241 has a square shape, and attaching holes 241a for attaching the tools 246 are vertically formed through the four corners. Also, fluid passages 241a are so formed as to communicate with the attaching holes 241c.

The portion 242 to be held and base 241 are integrated, and have a cylindrical shape coaxial with the central axis L as a whole. A plurality of engaging grooves 243 are formed at the root of the portion 242 to be held. In this embodiment, three engaging grooves 243 are formed at equal intervals (120° intervals) in the circumferential direction of the portion 242 to be held. The holding members 253 are releasably engaged with the engaging grooves 243. By this engagement, the holding portion 24 is held by the movable portion 25. Since the engaging grooves 243 and holding members 253 are formed at equal intervals in the circumferential direction, the holding portion 24 can be supported in a well-balanced manner, and can easily be supported on the same axis as the central axis L1.

A pivot regulation target portion 244 is formed in the circumferential surface of the portion 242 to be held. The pivot regulation target portion 244 forms a pivot regulating mechanism for regulating the pivot of the holding portion 24 around the central axis L with respect to the movable portion 25, together with a pivot regulating member 251e (FIG. 16) of the movable portion 25. In this embodiment, the pivot regulation target portion 244 is a groove which vertically extends and opens upward. When the pivot regulating member 251e engages with the inside wall of the groove, the pivot of the holding portion 24 with respect to the movable portion 25 is regulated.

The upper portion of the portion 242 to be held has a conical shape (more specifically, a truncated conical shape) which is coaxial with the central axis L and tapers off upward, and the circumferential surface of the upper portion forms an abutting surface 242b which abuts against the movable portion 25. In this embodiment, the abutting surface 242b is a conical surface which is coaxial with the central axis L and tapers off upward. The passage formation member 22a1 (FIG. 10) formed in the elevating shaft 22a is inserted into a central hole 245 of the portion 242 to be held.

The tool 246 is a suction tool including a tool main body 246a and a bellows-like suction pad 246b. The upper portion of the tool main body 246a is fitted in the attaching hole 241a, and the suction pad 246b is fitted on the lower portion of the tool main body 246a. The tool main body 246a has a fluid passage 246c (FIG. 10) which communicates with the fluid passage 241a. The fluid passage 246c has a central hole which is formed inside the tool main body 246a and vertically extends, and a horizontal hole which is formed in the upper portion of the tool main body 246a and causes the central hole to communicate with the outside. The suction pad 246b communicates with the fluid passage 246c and opens downward. By drawing air from the lower portion of the suction pad 246b, a work is chucked and held by the suction pad 246b. When chucking a work, the bellows-like portion of the suction pad 246b shrinks, and the suction holding surface of the chucked work is abutted against the lower end portion (the lower end of the central hole) of the tool main body 246. Since this regulates the vertical movement of the chucked work, the tool 246 stably positions and holds the work.

Figure 8:
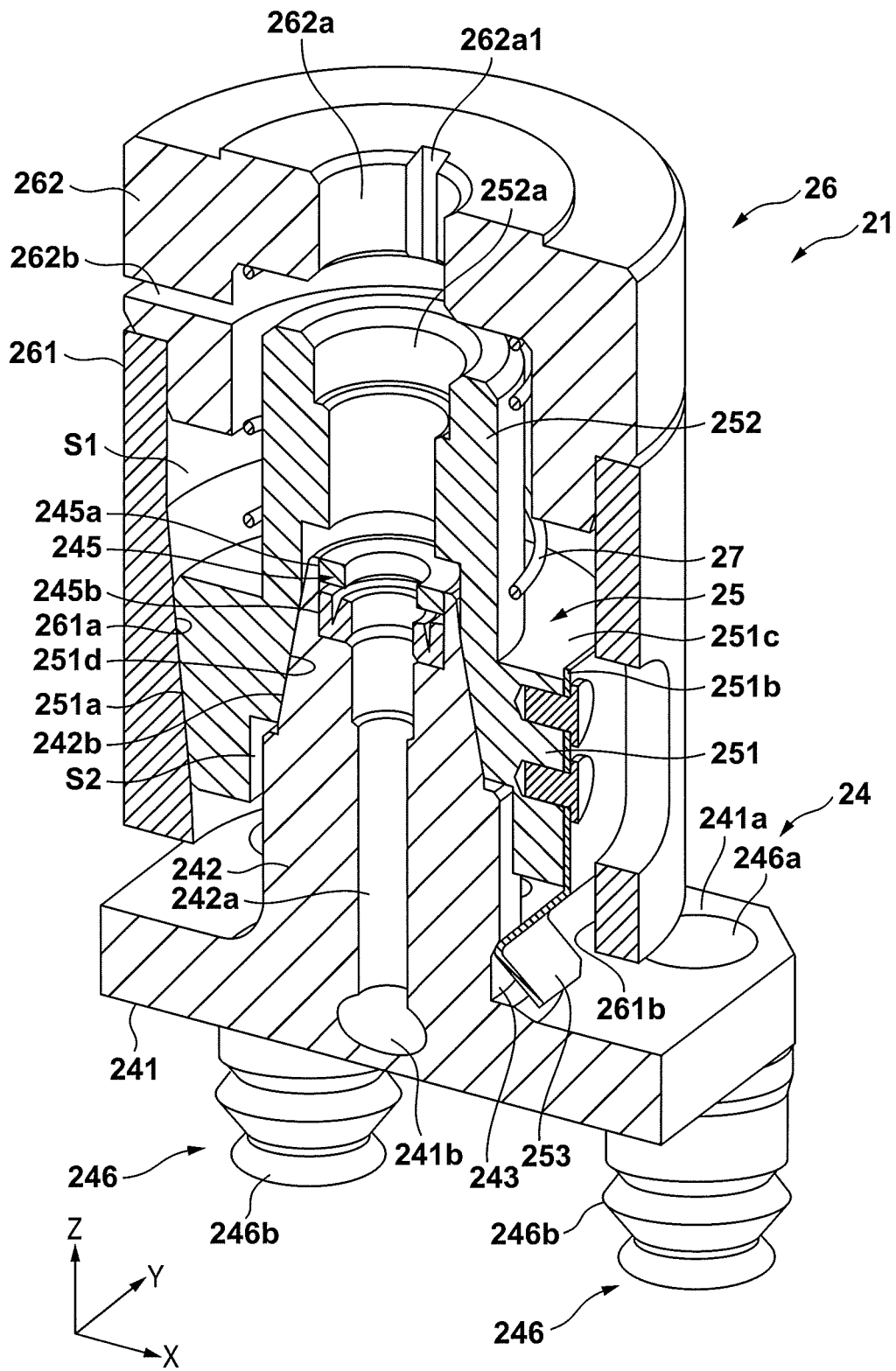
FIG. 8 is a sectional view of the holding unit shown in FIG. 3.

FIGS. 8 and 9 are vertical sectional views of the holding unit 21. That is, FIG. 8 is a sectional view in which the section passes through the midpoint between opposite sides of the four sides of the base 241, and FIG. 9 is a sectional view in which the section passes through the diagonal of the base 241.

The movable portion 25 is inserted into or accommodated in the internal space S1 of the support portion 26 so as to be movable in the direction of the central axis L (the vertical direction). The biasing portion 27 is placed between the upper surface 251c of the movable portion 25 and the attaching portion 262 of the support portion 26, and biases the movable portion 25 downward.

Figure 13:
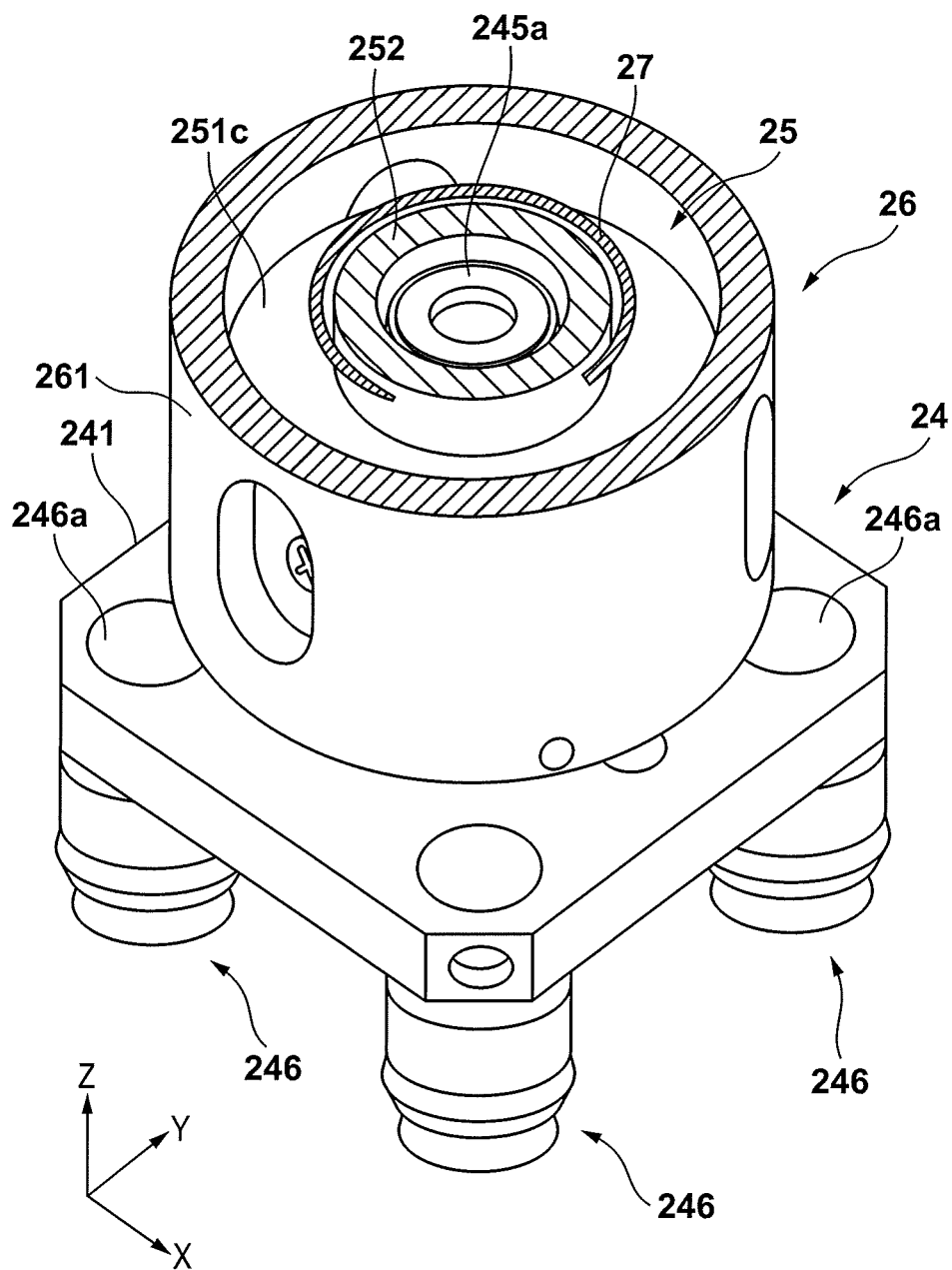
FIG. 13 is a sectional view of the holding unit shown in FIG. 3.
Figure 14:
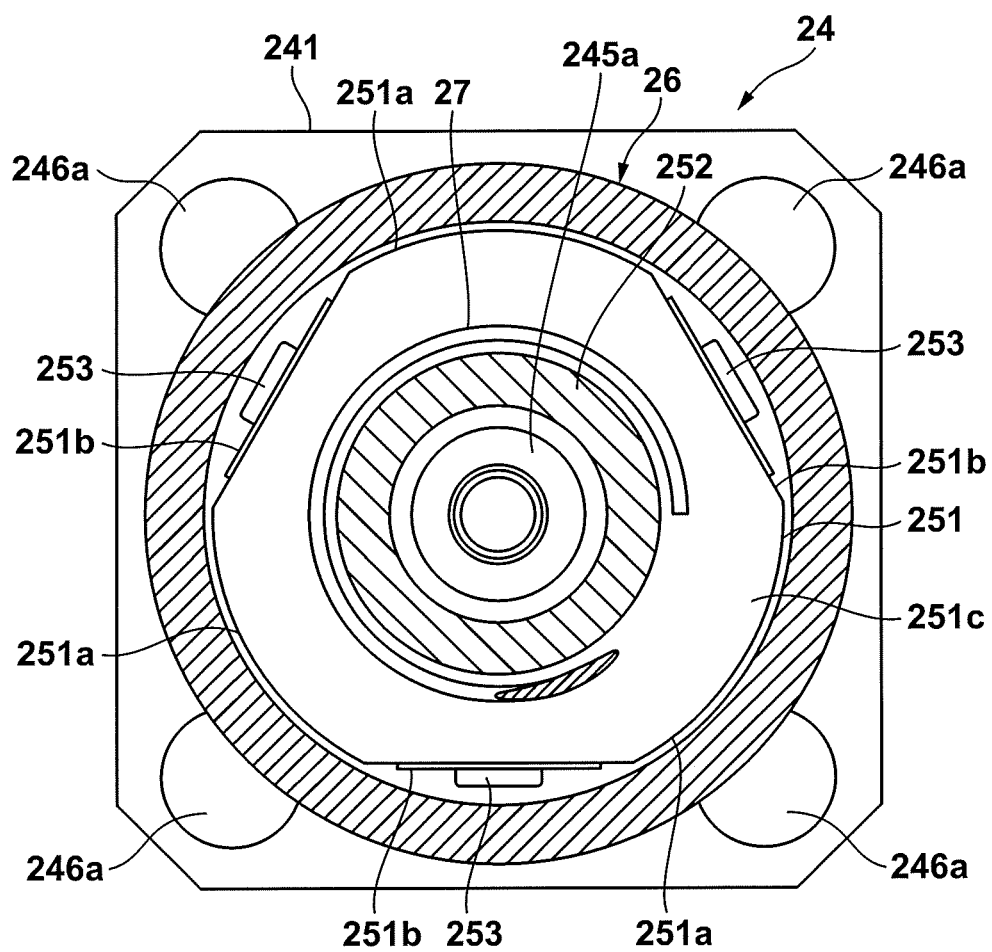
FIG. 14 is a sectional view of the holding unit shown in FIG. 3.
Figure 15:
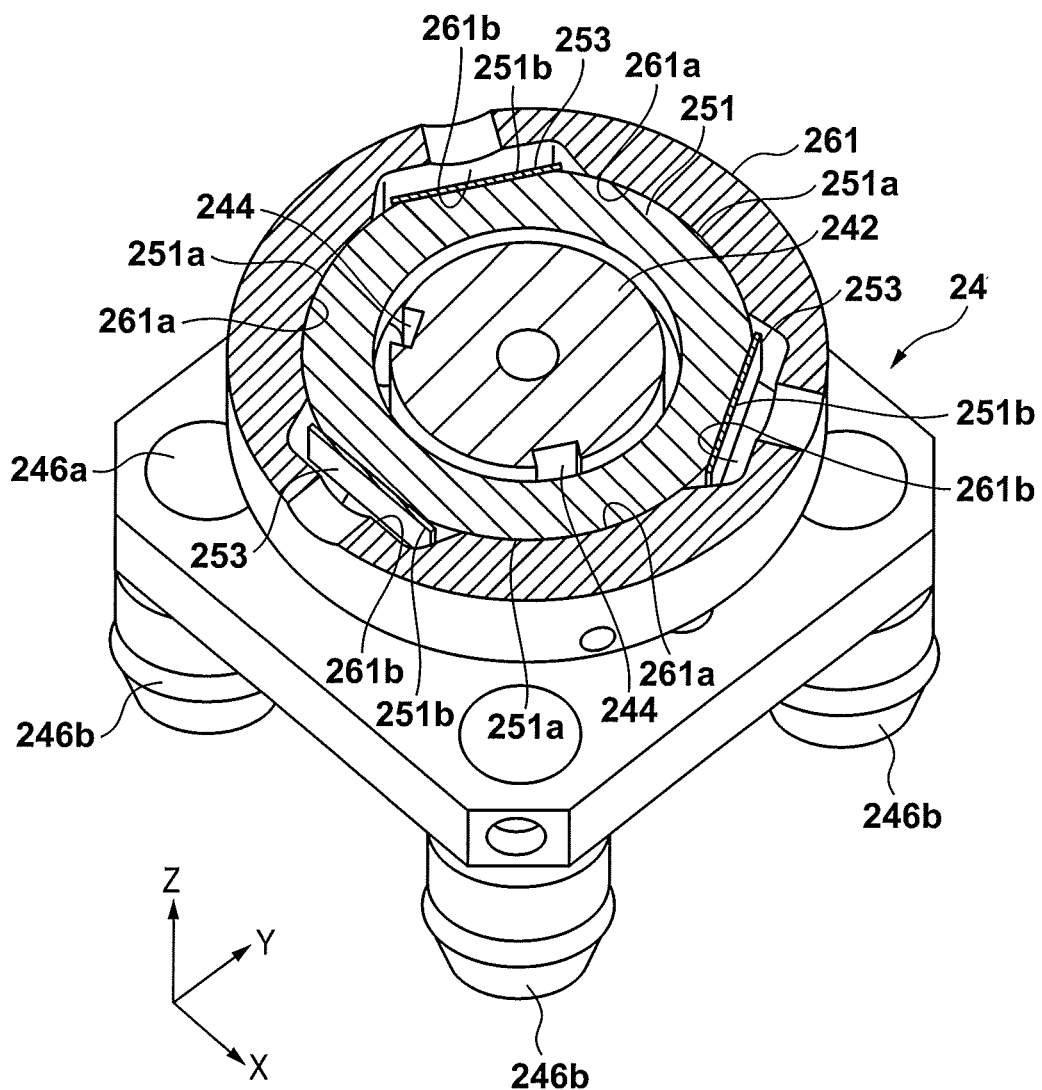
FIG. 15 is a sectional view of the holding unit shown in FIG. 3.
Figure 16:
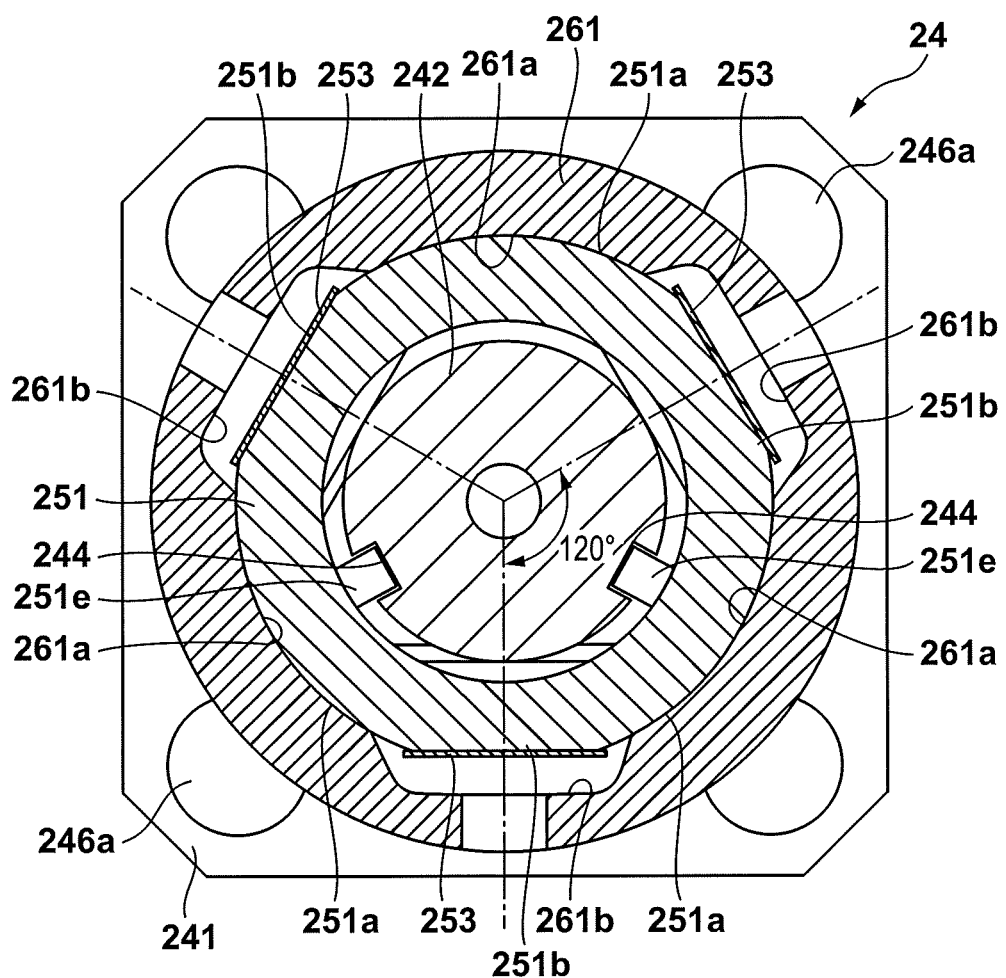
FIG. 16 is a sectional view of the holding unit shown in FIG. 3.

The inner wall defining the internal space S1 of the main body 261 has a portion which guides the vertical displacement of the movable portion 25. The upper portion of this inner wall defining the internal space S1 has a cylindrical shape, and the lower portion thereof forms a funnel-shaped surface (in other words, a conical surface (more specifically, a truncated conical surface)) which is coaxial with the central axis L and tapers off downward as a whole. FIGS. 13 and 14 are horizontal sectional views of the cylindrical portion 252 of the movable portion 25. That is, FIG. 13 is a perspective view, and FIG. 14 is a plan view. FIGS. 13 and 14 help understand the shape of the upper portion of the inner wall of the internal space S1. FIGS. 15 and 16 are horizontal sectional views of the main body 251 of the movable portion 25. That is, FIG. 15 is a perspective view, and FIG. 16 is a plan view. FIGS. 15 and 16 help understand the shape of the lower portion of the inner wall of the internal space S1.

On the inner wall defining the internal space S1, guide surfaces 261a and recesses 261b are alternately formed in the circumferential direction. In this embodiment, the guide surfaces 261a are formed in positions facing the abutting surfaces 251a of the movable portion 25, and the recesses 261b are formed in positions facing the attaching portions 251b. FIGS. 15 and 16 help understand the positional relationship between the guide surfaces 261a and the abutting surfaces 251a, and the positional relationship between the recesses 261b and the attaching portions 251b. The recesses 261b allow the guide surfaces 261a of the main body 261 to guide the abutting surfaces 251a of the movable portion 25, while avoiding interference between the holding members 253 and the support portion 26 in the attaching portions 251b.

The guide surface 261a is a funnel-shaped surface (conical surface) which is coaxial with the central axis L and tapers off downward. The abutting surface 251a of the movable portion 25 abuts against the guide surface 261a of the support portion 26 by being pushed by the biasing force of the biasing portion 27. The abutting surface 251a and guide surface 261a are inclined surfaces having the same slope. Although the movable portion 25 is vertically displaceable, the abutting surface 251a abuts against the guide surface 261a when the movable portion 25 is displaced downward from above by the biasing force of the biasing portion 27. This abutting guides (centers) and positions the center of the movable portion 25 on the same axis as the central axis L, because the support portion 26 is attached to the elevating shaft by the attaching portion 262 such that the central axis L matches the central axis of the support portion 26.

The movable portion 25 has a hole which forms an internal space S2 into which the holding portion 24 (particularly, the portion 242 to be held) is inserted. The upper portion of the internal space S2 communicates with the central hole 252a, and the lower portion thereof opens downward. The lower portion of the inner wall defining the internal space S2 has a cylindrical shape, and the upper portion thereof forms a funnel-shaped surface (in other words, a conical surface (more specifically, a truncated conical surface)) which is coaxial with the central axis L and tapers off upward as a whole.

Figure 11:
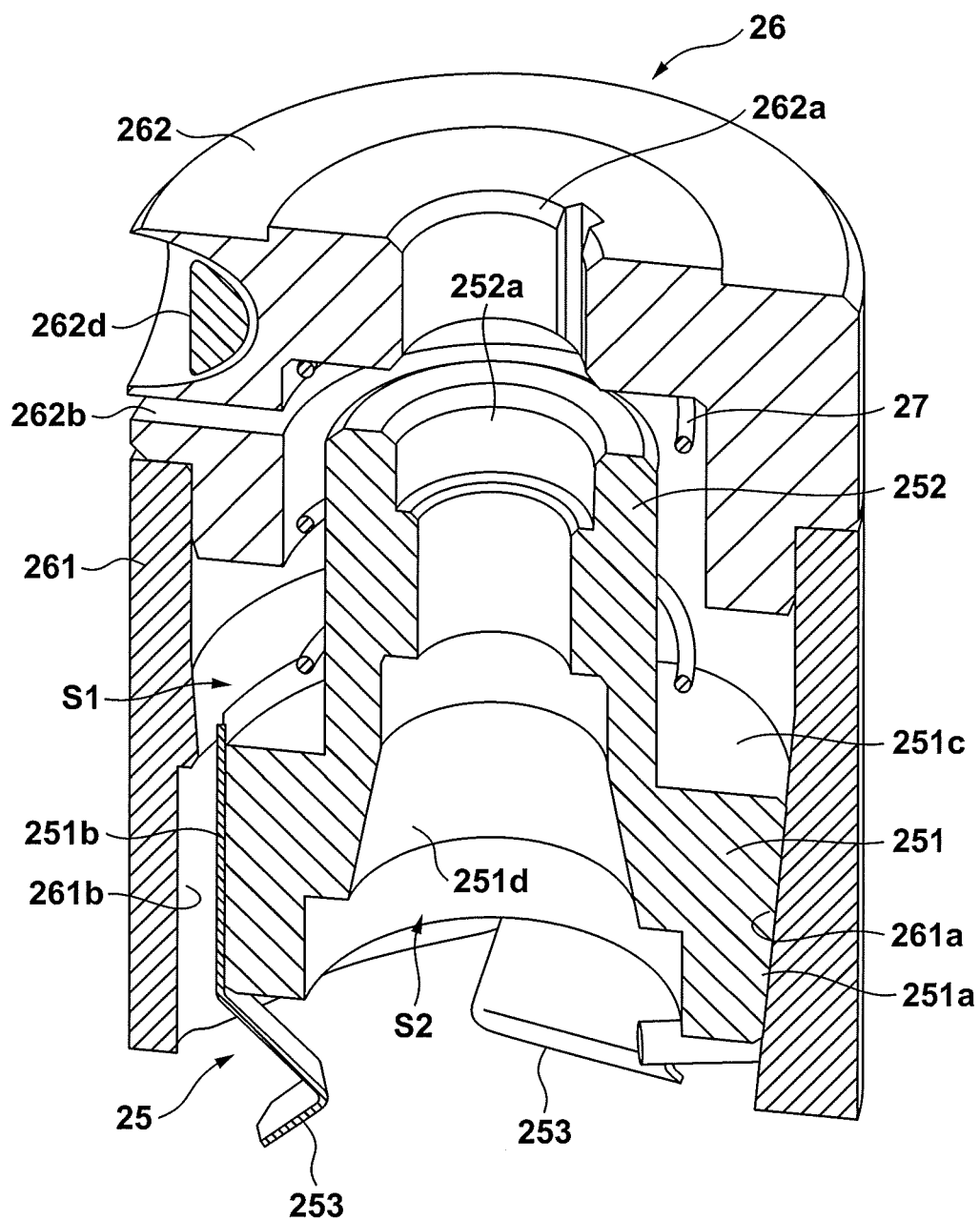
FIG. 11 is an exploded perspective view of the arrangement of a part of the holding unit shown in FIG. 3.

The inner wall of the upper portion of the internal space S2 has a guide surface 251d to which the holding portion 24 is attached. FIG. 11 is a vertical sectional view of the movable portion 25 and support portion 26 when the holding portion 24 is removed. FIG. 11 helps understand the shape of the inner wall of the internal space S2.

The guide surface 251d is formed in a position facing the abutting surface 242b of the portion 242 to be held. The guide surface 251d is a funnel-shaped surface (conical surface) which is coaxial with the central axis L and tapers off upward. The abutting surface 242b and guide surface 251d are inclined surfaces having the same slope. When the portion 242 to be held is inserted upward into the internal space S2 from below in order to attach the holding portion 24 to the movable portion 25, the abutting surface 242b abuts against the guide surface 251d. Consequently, the center of the holding portion 24 is guided (centered) and positioned on the same axis as the central axis L. Then, the holding portion 24 is attached to the movable portion 25 by engaging the holding member 253 with the engaging groove 243.

When the holding portion 24 is attached to the movable portion 25, the pivot regulation target portion 244 and the pivot regulating member 251e of the movable portion 25 engage with each other. In this embodiment, as shown in FIGS. 15 and 16, the pivot regulating member 251e is a pin-like member projecting inward in the radial direction from the inner wall of the internal space S2 of the movable portion 25. In this embodiment, two pairs of the pivot regulating members 251e and pivot regulation target portions 244 are formed, and the two pairs are spaced apart by 120° in the circumferential direction. When attaching the holding portion 24 to the movable portion 25, the two pairs of the pivot regulating members 251e and pivot regulation target portions 244 are also used for alignment (phase matching) of the holding portion 24 to the movable portion 25 in the circumferential direction.

The pivot regulation target portion 244 is a vertical groove having an upper open end. When attaching the holding portion 24 to the movable portion 25, therefore, the pivot regulating member 251e is inserted into the pivot regulation target portion 244 from its upper open end, and engaged not in the insertion/extraction direction of the holding portion 24 but in the circumferential direction. This regulates the pivot of the holding portion 24 with respect to the movable portion 25, and prevents the posture of a held work from unexpectedly changing.

Figure 12:
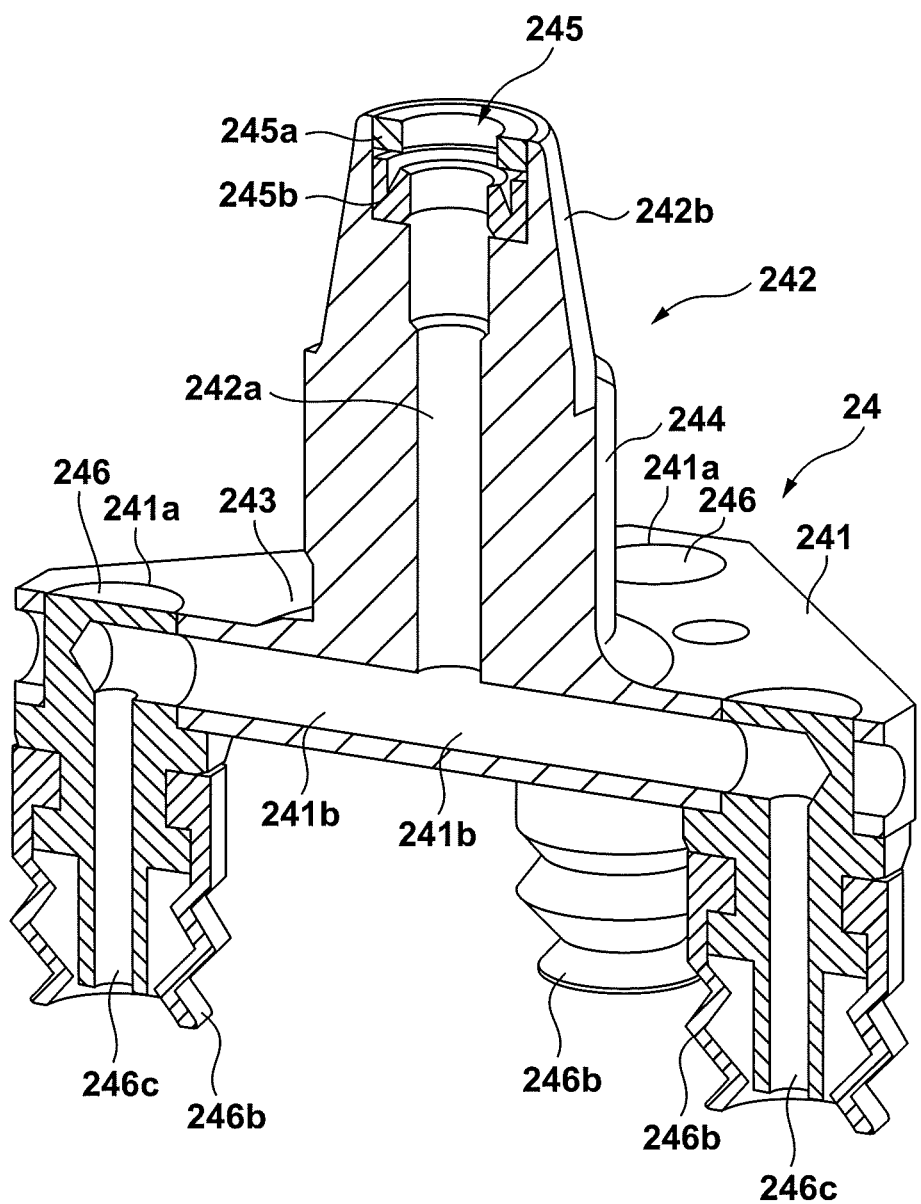
FIG. 12 is an exploded perspective view of the arrangement of a part of the holding unit shown in FIG. 3.

As shown in FIG. 8, 9, or 12, a lower portion 242a of the central hole 245 formed in the holding portion 24 communicates with the fluid passage 241b, thereby forming a fluid passage. FIG. 12 is a vertical sectional view of the holding portion 24. The fluid passage 241b is formed to intersect the diagonal of the base 241, and the lower portion 242a is connected to the intersection. The fluid passage 241b also communicates with the fluid passage 246c.

Figure 10:
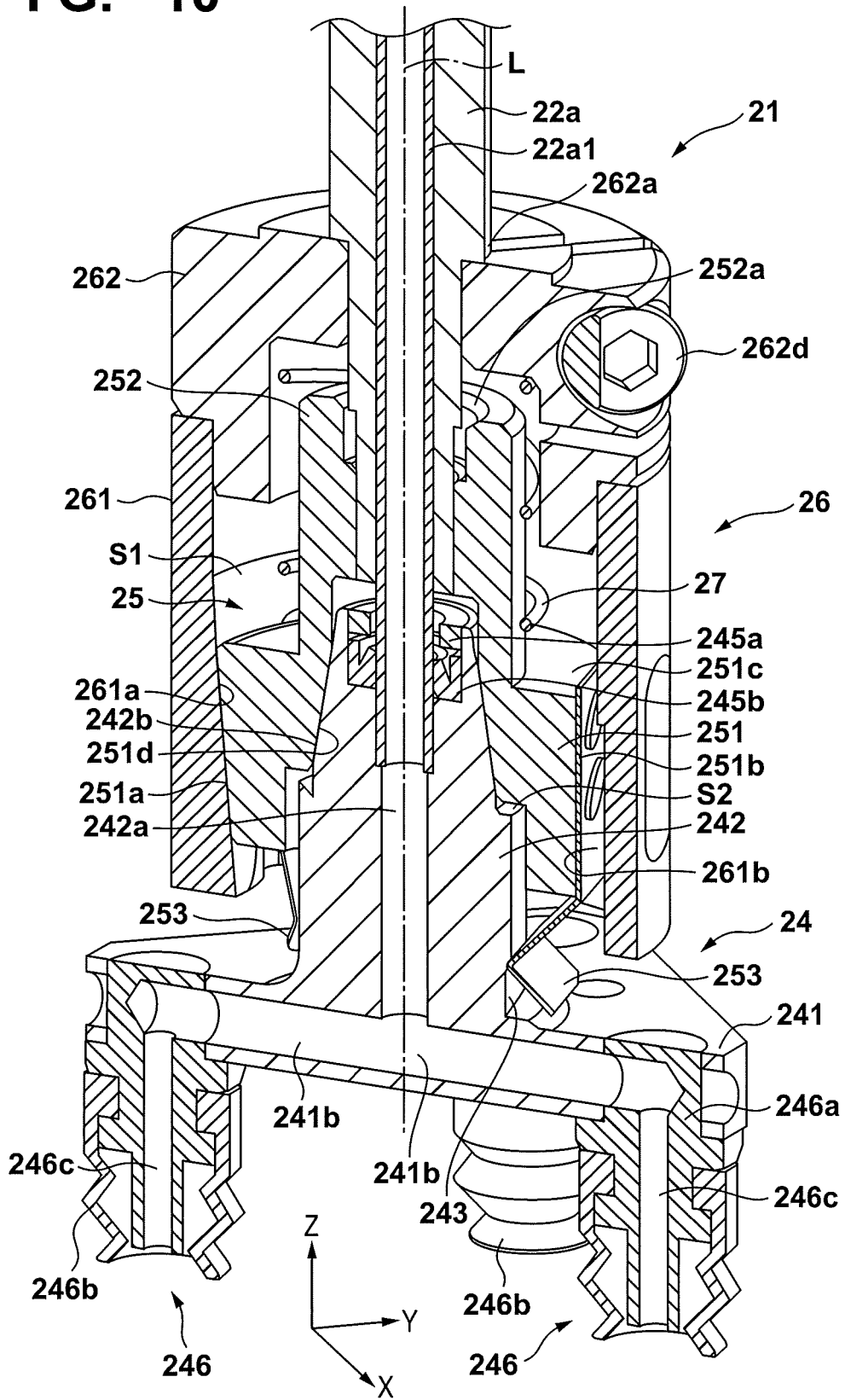
FIG. 10 is a sectional view of the arrangement of a part of the transfer unit shown in FIG. 2.

A seal member 245b and an encapsulating member 245a for encapsulating the seal member 245b in the central hole 245 are fitted in the upper portion of the central hole 245. As shown in FIG. 10, the lower end portion of the passage formation member 22a1 is inserted into the central hole 245, and connected to the holding portion 24 by being airtightly sealed with the seal member 245b. The passage formation member 22a1 is a cylindrical member coaxial with the elevating shaft 22a, and is so formed as to be vertically movable in the elevating shaft 22a, thereby forming an air passage. In the state shown FIG. 10, the connecting portion 23 (FIG. 2), passage formation member 22a1, and fluid passages 241b and 246c communicate with each other. Since the passage formation member 22a1 is vertically movable in the elevating shaft 22a, the holding portion 24 is vertically displaceable with respect to the elevating shaft 22a while maintaining the airtightness.

<Function of Holding Unit>

Figure 17:
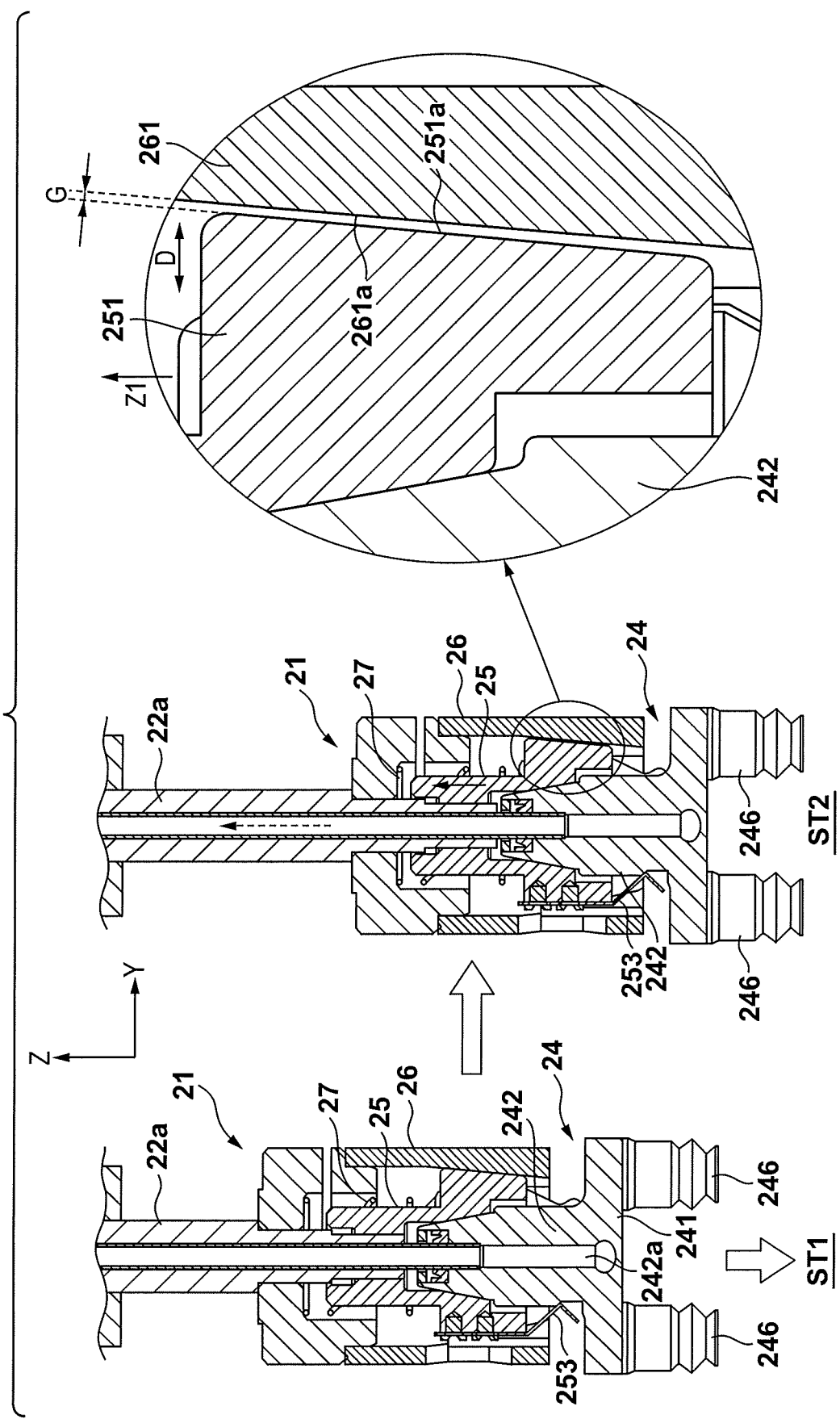
FIG. 17 is a view for explaining the operation of the holding unit shown in FIG. 3 and a partially enlarged view of the holding unit.

An operation example of the holding unit 21 will be explained with reference to FIG. 17. FIG. 17 shows an operation when holding a work.

In state ST1, the holding unit 21 is moved down in order to pick up a work (not shown). In this state, the movable portion 25 is pushed down by the biasing force of the biasing portion 27, and the guide surface 261a and abutting surface 251a abut against each other. That is, the movable portion 25 and the holding portion 24 supported by the movable portion 25 are positioned on the same axis as that of the elevating shaft 22a.

In state ST2, the holding portion 24 abuts against a work (not shown) from above. In this state, an impact when the holding unit 21 abuts against the work is buffered by elastic deformation of the suction pad 246b and by a floating function. The floating function is a function of displacing the movable portion 25 and holding portion 24 upward with respect to the support portion 26 against the biasing force of the biasing portion 27.

As shown in an enlarged view of FIG. 17, when the movable portion 25 is displaced relatively upward (in the direction of an arrow Z1) with respect to the support portion 26, the guide surface 261a and abutting surface 251a are separated from each other. The movable portion 25 is released from positioning in the horizontal direction, and becomes displaceable only by a gap G in the direction of an arrow D. The arrow D is an arbitrary horizontal direction. That is, the movable portion 25 and holding portion 24 are released from positioning in the horizontal direction, but permitted to change their postures. The gap G increases as the position ascends. Therefore, even when the posture (in this case, the horizontal posture) of a work to be picked up has an error (for example, an inclination of the work before being picked up with respect to the horizontal plane), the movable portion 25 and holding portion 24 are displaced or change their postures in accordance with the posture (inclination) of the work. This prevents any excessive force from being applied to the work. In addition, each suction pad 246b is reliably abutted against the work holding surface, so the work can accurately and reliably be chucked and held.

In state ST2, the work is held by the holding portion 24 when negative-pressure suction is started. When the holding unit 21 is raised after that, the work is picked up. When the holding unit 21 is raised, the movable portion 25 is pushed downward by the biasing force of the biasing portion 27, the abutting surface 251a is guided by the guide surface 261a, and the guide surface 261a and abutting surface 251a abut against each other again in the circumferential direction. That is, as in state ST1, the movable portion 25 and the holding portion 24 supported by the movable portion 25 are positioned on the same axis as that of the elevating shaft 22a again. Also, when releasing the held work in the transfer destination, the work can be released while maintaining the positioned state of the movable portion 25 and holding portion 24. This makes it possible to prevent a decrease in work positional accuracy.

Figure 18:
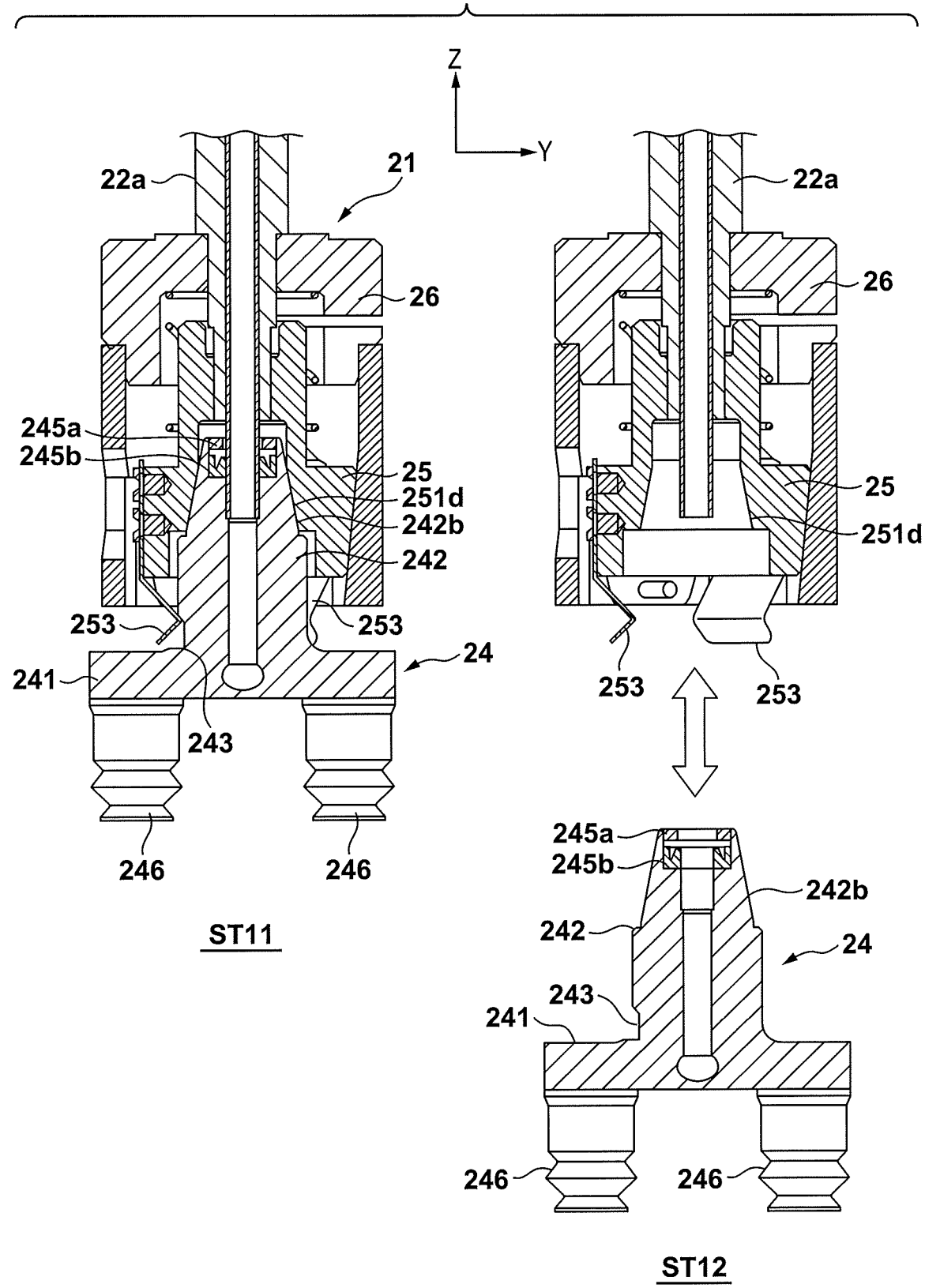
FIG. 18 is a view for explaining the operation of the holding unit shown in FIG. 3.

States ST11 and ST12 shown in FIG. 18 illustrate states in which the holding portion 24 is attached and detached. In this embodiment, the holding member 253 is formed by a leaf spring. Therefore, when the holding portion 24 is strongly pulled down from state ST11, the holding portion 24 is separated from the movable portion 25 as they are disengaged from each other.

When reattaching the holding portion 24, the portion 242 to be held of the holding portion 24 is inserted upward into the internal space S2 of the movable portion 25 from below. Since the guide surface 251d abuts against the abutting surface 242b and guides it, the central axes of the holding portion 24 and movable portion 25 are centered, and the two portions are coaxially positioned. In this embodiment, the pair of the abutting surface 251a and guide surface 261a is a pair of surfaces which taper off downward, and the pair of the abutting surface 242b and guide surface 251d is a pair of surfaces which taper off upward. That is, the tapering directions are opposite. Also, as in the example shown in FIG. 17, the movable portion 25 is displaced upward when attaching the holding portion 24 to the removable portion 25. When this attachment is complete, the movable portion 25 is pushed down by the biasing force of the biasing portion 27, the abutting surface 251a is guided by the guide surface 261a, and the guide surface 261a and abutting surface 251a abut against each other again in the circumferential direction. That is, the central axes of the movable portion 25 and holding portion 24 are centered, so these two portions are positioned on the same axis as that of the elevating shaft 22a. Accordingly, even when a given holding portion 24 is detached from the movable portion 25 and a new holding portion 24 is reattached to the movable portion 25, the new holding portion 24 can be reattached to the removable unit 25 with high accuracy and high reproducibility. As a consequence, attachment and detachment of the holding portion 24 have no influence on the positioning accuracy of a work.

Especially when preparing a plurality of types of the holding portions 24 in accordance with the types of works, the portions 242 to be held are given a common specification. Regardless of the type of the holding portion 24 to be used, therefore, the holding portion 24 can be attached to the movable portion 25 while the central axis of the holding portion 24 is matched with the central axis L. Consequently, when capturing an image of a work held by the holding portion 24 by the image capturing unit 6 and calculating a work holding position with respect to the holding portion 24, the work holding position can accurately be calculated because a reference point as a calculation reference is the central axis L. Accordingly, the held work can accurately be transferred to the transfer position in the transfer destination.

Furthermore, even when transferring a held work to the transfer destination while changing the posture (direction) of the work, the central axis L and the central axis of the holding portion 24 match each other as the rotation center. Even when the held work is rotated, therefore, the holding position of the rotated work can easily be calculated, and the work having the changed posture can accurately be transferred to the transfer destination.

OTHER EMBODIMENTS

In the abovementioned embodiment, the abutting surfaces 251a and 242b and guide surfaces 261a and 251d are curved surfaces. However, these surfaces may also be flat inclined surfaces. That is, the tapered shape need not be a conical shape and may also be a pyramidal shape.

In the abovementioned embodiment, the abutting surface 251a and guide surface 261a are surfaces which taper off downward. However, these surfaces may also be surfaces which taper off upward. Similarly, the abutting surface 242b and guide surface 251d are surfaces which taper off upward in the above embodiment, but these surfaces may also be surfaces which taper off downward.

In the abovementioned embodiment, the movable portion 25 is accommodated in the support portion 26. However, a part of the support portion 26 may also be inserted into the movable portion 25. Likewise, a part of the holding portion 24 is inserted into the movable portion 25 in the above embodiment, but a part of the movable portion 25 may also be inserted into the holding portion 24.

While the present invention has been described with reference to exemplary embodiments, it is to be understood that the invention is not limited to the disclosed exemplary embodiments. The scope of the invention is to be accorded the broadest interpretation so as to encompass all such modifications and equivalent structures and functions.

This application claims the benefits of Japanese Patent Application No. 2016-192088, filed Sep. 29, 2016, which is hereby incorporated by reference herein in its entirety.

What is claimed is:

1. A transfer unit comprising:
a holding unit configured to hold a workpiece; and
a driving unit configured to vertically move the holding unit,
wherein the holding unit includes:
a holding portion configured to hold the workpiece;
a movable portion configured to support the holding portion;
a support portion configured to support the movable portion such that the movable portion is vertically displaceable; and
a biasing portion configured to bias the movable portion downward with respect to the support portion,
the support portion has a first guide surface which guides displacement of the movable portion,
the movable portion has a first abutting surface which abuts against the first guide surface, and
each of the first guide surface and the first abutting surface is a surface which tapers off upward or downward, such that the first guide surface and the first abutting surface abut against each other and are positioned vertically with respect to each other when the movable portion is displaced downward with respect to the support portion.

2. The transfer unit according to claim 1, wherein
the holding portion is attached to the movable portion such that the holding portion is vertically detachable,
the movable portion further includes a second guide surface which guides attachment of the holding portion,
the holding portion further includes a second abutting surface which abuts against the second guide surface, and
each of the second guide surface and the second abutting surface is a surface which tapers off upward or downward, such that the second guide surface and the second abutting surface abut against each other and are positioned when the holding portion is attached to the movable portion.

3. The transfer unit according to claim 2, wherein
the driving unit is configured to pivot the holding unit around a vertical axis,
the first guide surface is a first funnel-shaped surface which forms a part of an inner wall of a first hole which is formed in the support portion and coaxial with the axis, and into which the movable portion is inserted, and
the second guide surface is a second funnel-shaped surface which forms a part of an inner wall of a second hole which is formed in the movable portion and coaxial with the axis, and into which the holding portion is inserted, and,
each of the first abutting surface and the second abutting surface is a conical surface coaxial with the axis.

4. The transfer unit according to claim 3, further comprising a pivot regulating mechanism configured to regulate pivot around the axis of the holding portion with respect to the movable portion,
wherein the pivot regulating mechanism includes:
a pivot regulating member projecting from an inner wall of the second hole of the movable portion; and
a pivot regulation target portion which is formed in the holding portion, engages with the pivot regulating member in a circumferential direction of the axis, and does not engage in an insertion or extraction direction of the holding portion.

5. The transfer unit according to claim 3, wherein
the holding portion includes:
a main body having a portion to be inserted into the second hole; and
a tool which is formed in a lower portion of the main body and holds the workpiece,
the tool is a suction tool which chucks the workpiece,
the driving unit includes a vertically extending hollow attaching member to which the holding unit is attached,
a passage formation member which forms an air passage is formed inside the attaching member, such that the passage formation member is vertically movable in the attaching member, and
the passage formation member is connected to the holding portion.

6. The transfer unit according to claim 1, wherein
the support portion is in a form of a cylindrical member,
the movable portion is formed in an internal space of the cylindrical member such that the movable portion is movable in an axial direction of the cylindrical member,
the first guide surface is a conical surface which forms a part of an inner wall of the internal space, and
the first abutting surface is a conical surface which forms a part of an outer circumferential surface of the movable portion.

7. The transfer unit according to claim 6, wherein
the movable portion includes a holding member configured to detachably hold the holding portion, and
the holding portion includes a portion which is held by the holding member.

8. The transfer unit according to claim 7, wherein
the first guide surface and a recess in which the holding member is accommodated are formed in a circumferential direction on the inner wall of the support portion, and the first abutting surface and an attaching portion of the holding member are formed in a circumferential direction on the outer circumferential surface of the movable portion.

9. A transfer apparatus comprising:
   the transfer unit according to claim 1;
   a driving unit configured to move the transfer unit from a workpiece transfer source to a workpiece transfer destination, and
   an image capturing unit configured to capture, from below, an image of the workpiece held by said holding portion.

* * * * *